US008130996B2

(12) United States Patent
Kling et al.

(10) Patent No.: US 8,130,996 B2
(45) Date of Patent: Mar. 6, 2012

(54) LOUD SPEAKER GROUP ASSEMBLED FROM A PLURALITY OF LOUD SPEAKERS WITH SNAP-ON CONNECTIONS

(75) Inventors: Martin Kling, Hannover (DE); Utz Ruescher, Braunschweig (DE)

(73) Assignee: K & F Beteiligungen GmbH, Hannover (DE)

( * ) Notice: Subject to any disclaimer, the term of this patent is extended or adjusted under 35 U.S.C. 154(b) by 943 days.

(21) Appl. No.: 12/150,917

(22) Filed: May 1, 2008

(65) Prior Publication Data

US 2008/0310661 A1 Dec. 18, 2008

(30) Foreign Application Priority Data

May 4, 2007 (DE) ......................... 10 2007 021 373
May 28, 2007 (DE) ......................... 10 2007 025 015
Apr. 4, 2008 (DE) ......................... 10 2008 017 507

(51) Int. Cl.
*H04R 1/02* (2006.01)
*H05K 5/00* (2006.01)
*A47H 1/10* (2006.01)

(52) U.S. Cl. .......... 381/386; 381/87; 381/332; 381/336; 381/387; 181/144; 248/317; 248/323; 248/340; 248/343

(58) Field of Classification Search .................... 381/87, 381/332, 335, 182, 336, 345, 386, 387; 181/144, 181/150, 199, 30, 148; 248/317, 323, 340, 248/343, 324

See application file for complete search history.

(56) References Cited

U.S. PATENT DOCUMENTS 4,660,728 A * 4/1987 Martin .......................... 211/118
5,266,751 A * 11/1993 Taguchi ........................ 181/144
5,602,366 A * 2/1997 Whelan et al. ................ 181/144
5,749,137 A * 5/1998 Martin ............................ 29/434
5,758,852 A * 6/1998 Martin ....................... 248/282.1
5,819,959 A * 10/1998 Martin .......................... 211/118
5,996,728 A * 12/1999 Stark ............................. 181/144
6,640,924 B2 * 11/2003 Messner ....................... 181/144
6,652,046 B2 * 11/2003 Christner ...................... 312/111
7,261,180 B1 * 8/2007 Faranda et al. ............... 181/199
7,298,860 B2 * 11/2007 Engebretson et al. ........ 381/386
7,328,769 B1 * 2/2008 Adamson ...................... 181/199
7,415,124 B2 * 8/2008 Colich .......................... 381/335
7,634,100 B2 * 12/2009 Monitto et al. ............... 381/386
7,693,296 B2 * 4/2010 Monitto et al. ............... 381/386
7,813,516 B1 * 10/2010 Graber .......................... 381/182
7,997,552 B2 * 8/2011 Engebretson et al. ........ 248/317
2007/0000719 A1 * 1/2007 Bothe ........................... 181/150

* cited by examiner

FOREIGN PATENT DOCUMENTS

WO WO- 02/067243 8/2002

*Primary Examiner* — Anh Mai
*Assistant Examiner* — Joselito Baisa
(74) *Attorney, Agent, or Firm* — Jordan and Hamburg LLP

(57) ABSTRACT

A loud speaker group includes loud speakers which are equipped with joints on their front sides, and on their back sides, each is equipped with a mount for connectors with which the individual loud speakers can be connected to one another. For facilitating their assembly, the mount comprises two legs that are attached to the back side of the loud speaker box and enclose a channel in which the connector is displaceably movable. At its one end the mount has a row of holes for receiving a pin that extends through a hole on one end of a connector belonging to the adjacent loud speaker box and has at its other end a manually actuated spring-loaded snap-in pin. The snap-in pin is insertable through another hole disposed in front of the other end of the connector. One guide unit on each side of the snap-in pin limits the channel and are arranged perpendicular to the direction of movement of the connector and form guides for the connector. The loud speaker boxes are pre-assembled on the ground and then automatically self-adjust to the desired angle position when they are lifted to their work place.

11 Claims, 4 Drawing Sheets

LOUD SPEAKER GROUP ASSEMBLED FROM A PLURALITY OF LOUD SPEAKERS WITH SNAP-ON CONNECTIONS

BACKGROUND OF THE INVENTION

The invention relates to a loud speaker group in which a plurality of loud speakers are equipped with joints on their front sides and, on their back sides, are each equipped with a mount for connectors with which the individual loud speakers can be connected to one another with adjustable spacing.

One such loud speaker group is known from WO 02067243. It is used in large halls or open-air theaters in order to provide greatly amplified sound to large audiences. Since such large events occur only occasionally and the artists who are appearing at them like to bring their own loud speaker systems, the loud speaker systems must be assembled and disassembled for each event, which is no small task for the stagehands, because each of the loud speaker boxes that form a loud speaker group weighs so much that it is difficult for a single worker to carry it. However, the main difficulty for the stagehands is comprised in that the loud speaker boxes that are to be coupled to one another are very difficult to couple to one another on the ground because they must be coupled in front very close to one another, but their back sides must be spaced apart so that the loud speaker group attains its arched configuration, which is required for providing sound to large crowds. The stagehands make use of some tricks in order to accomplish this difficult task.

Known from DE 10 2005 022 869 A1 is a connecting device on loud speaker boxes that comprises hooks, each attached on both sides of each loud speaker box, which, when the loud speaker boxes that are connected by joints on their front sides are lifted, hook into pins inserted in a hole grid on the back side of the loud speaker boxes therebehind, creating in this first work step a force-fit connection, and then, in a second work step to be performed manually, securing pins that the hooks pass through must be secured in the hole grid, which then creates a positive fit. This securing work must be performed manually. A trained technician is required for this work. Because of this securing that is effected with the securing pins, lifting the loud speaker group into its working position disposed beneath the concert hall roof is very labor-intensive and time-consuming, because the lifting must be interrupted as each loud speaker box or partial group of loud speaker boxes is lifted from the ground in order to fasten the hooks in the connecting position by manually inserting the aforesaid securing pins. None of the securing pins must be forgotten. When disassembling the loud speaker group, disassembly efforts are again hampered because it is necessary to remove the securing pins manually.

The invention avoids the disadvantages of the prior art. It is the object of the invention to facilitate the work of the stagehands in that the loud speaker boxes can be placed on flat ground adjacent to one another, initially positioned provisionally connected to one another spaced apart as desired so that once they are lifted to their working location they drop automatically into their operating position, spaced as desired, due only to the effects of gravity, and are simultaneously and automatically fastened and simultaneously secured there by a pin snapping in.

SUMMARY OF THE INVENTION

The invention is comprised in the special configuration of the mount and of the connector and in the use of a resilient snap-in pin that permits the individual loud speaker boxes to drop precisely into their pre-set operating positions when the loud speaker group is lifted and thereby precisely sets the desired angle between the loud speaker boxes.

Individually, the features of the invention are as follows:

In accordance with a first feature, the mount comprises two parallel legs that enclose a channel between them in which the connector is displaceably and definably movable.

In accordance with a second feature, the legs that enclose the channel have at their one end a row of holes for receiving a pin that extends through a hole at one end of a connector belonging to the adjacent loud speaker box.

In accordance with a third feature, at their other end, the legs that enclose the channel can be passed through by a spring-loaded snap-in pin that has a grip at its one end and that under the force of a spring can be displaced in a pin housing attached to the one leg.

In accordance with a fourth feature, the snap-in pin can be pushed through another hole that is disposed more centrally in front of the other end of the connector.

And, in accordance with a fifth feature, one guide unit disposed above and one guide unit disposed below the snap-in pin limit the channel on both sides of this snap-in pin, and these guide units form guides for the connector.

With these means it was made possible for the stagehands to set up the loud speaker boxes on one plane and to pre-set the angular position of the individual loud speakers to one another so that when lifted the loud speakers in one group automatically assume the pre-set angular position in a force fit and in a positive fit. This saves the stagehands a great deal of time and effort because the force-fit and positive-fit connection for the individual loud speaker boxes is created automatically, without human intervention, when the group of loud speaker boxes is lifted because the snap-in pins automatically drop into the holes provided for them and remain there.

In this loud speaker combination the connector is usefully a flat bar that at its one end has a through-hole through which a pin can be inserted prior to the loud speaker group being assembled and that has a second hole approximately in the center into which a snap-in pin automatically drops when the loud speaker group is lifted into the work position.

In order not to lose this connector during transport of the individual loud speakers, which are not connected to one another, it is advantageous that between the two through-holes on the ends the flat bar that forms the connector has a blind hole in which the snap-in pin that is under spring force rests when it is the non-operating state.

The device that guides the connector under the resilient snap-in pin and that ensures that the snap-in pin drops into the hole of the connector provided for this purpose can be two guide units in the form of blocks that are rounded on at least one longitudinal side and that have the width of the channel or can be two sleeves, two pins, or two screws.

In this loud speaker combination the effective length of the connector and thus the angle between each two loud speaker boxes can advantageously be adjusted in that on the sides of the legs facing away from the snap-in pin are arranged a plurality of closely disposed holes for a pin that is to pass through the legs and the connector. These holes can also be arranged in two rows, one above the other, offset by half the width of a hole.

So that the mounting device itself also has the required strength in both its legs that form the channel for the connector, it is advantageous for the two legs to be connected on their upper edges by screws and a sleeve that is borne between the legs and placed over the screw and the length of which equals the width of the channel.

The essence of the invention is explained in greater detail in the following using an exemplary embodiment schematically depicted in the drawings.

DETAILED DESCRIPTION OF THE INVENTION

Figure 1:
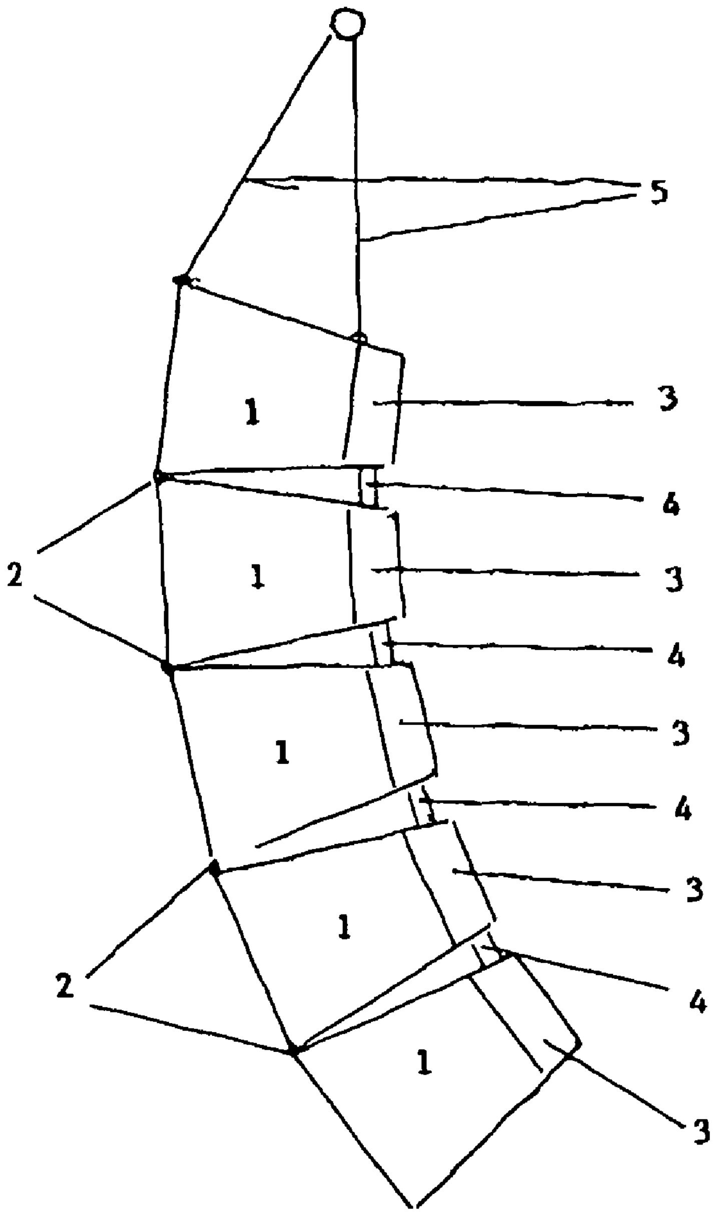
FIG. 1 is a hanging group of loud speaker boxes.

The loud speaker combination depicted in FIG. 1 comprises five loud speaker boxes 1 that are connected to one another on their front sides by joints 2 and that bear on their back sides mounts 3 for connectors 4 with which the spacing between the back sides of the loud speaker boxes 1 can be adjusted as soon as they are lifted, using the cable 5, into the operating position for their use.

Figure 2:
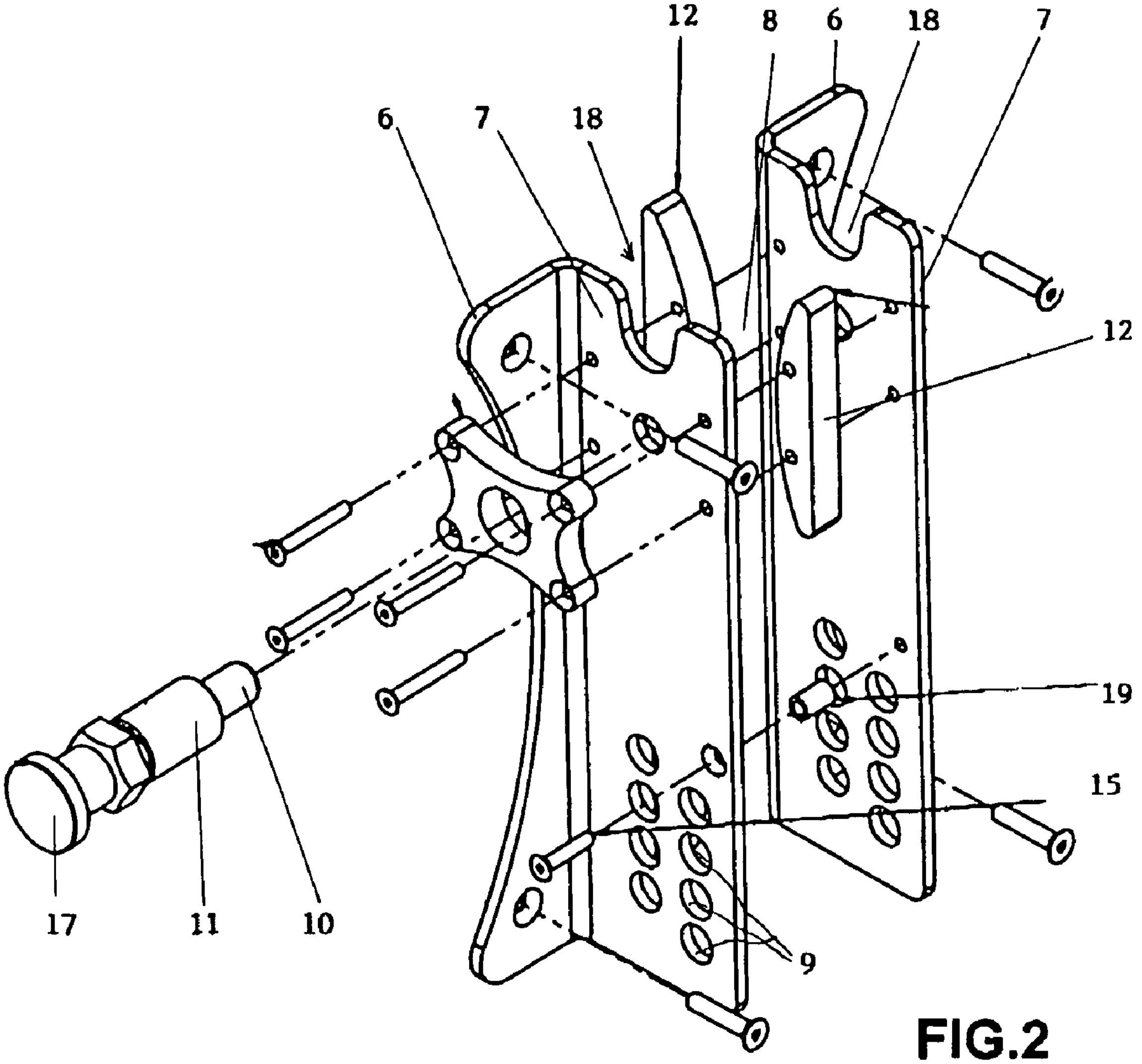
FIG. 2 is an exploded depiction of the rear mount of a loud speaker box.
Figure 3:
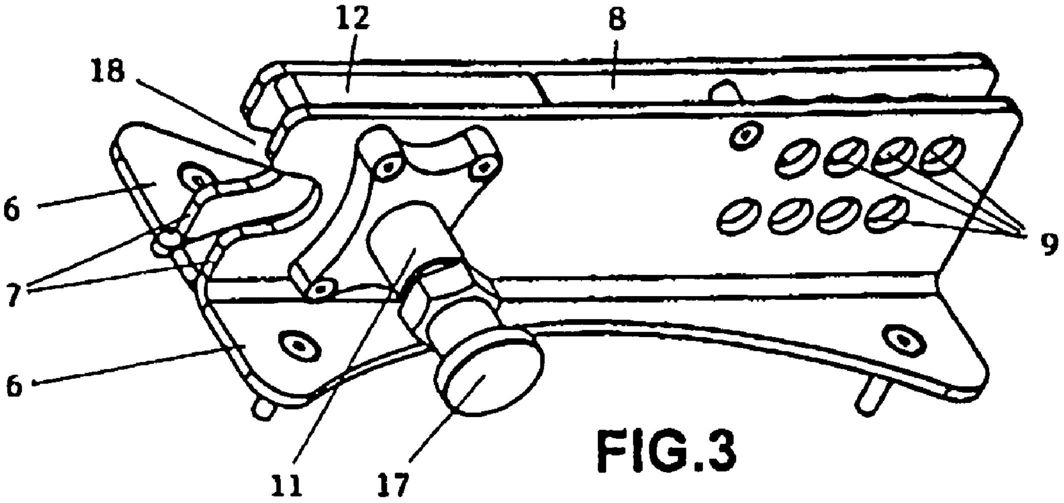
FIG. 3 is a perspective view of the mount.
Figure 4:
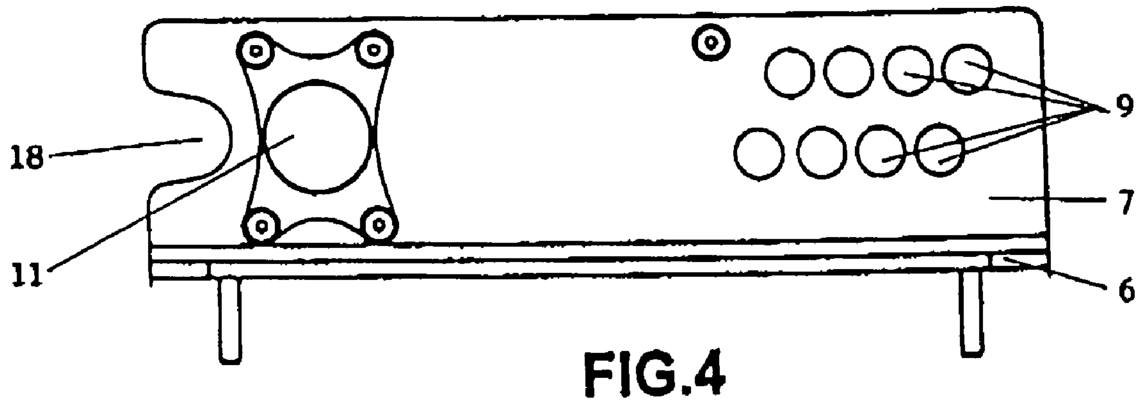
FIG. 4 is a side view of the mount.
Figure 5:
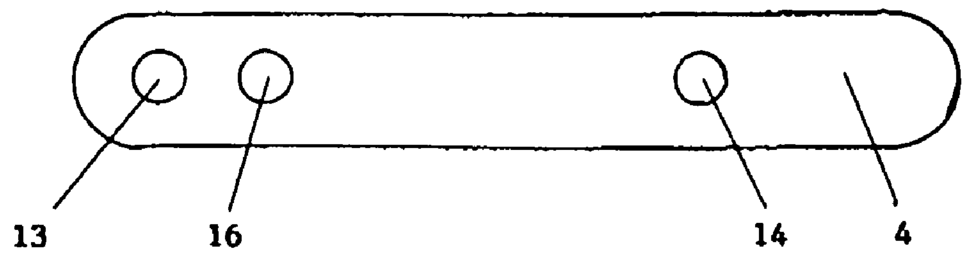
FIG. 5 is a side view of the connector.
Figure 6:
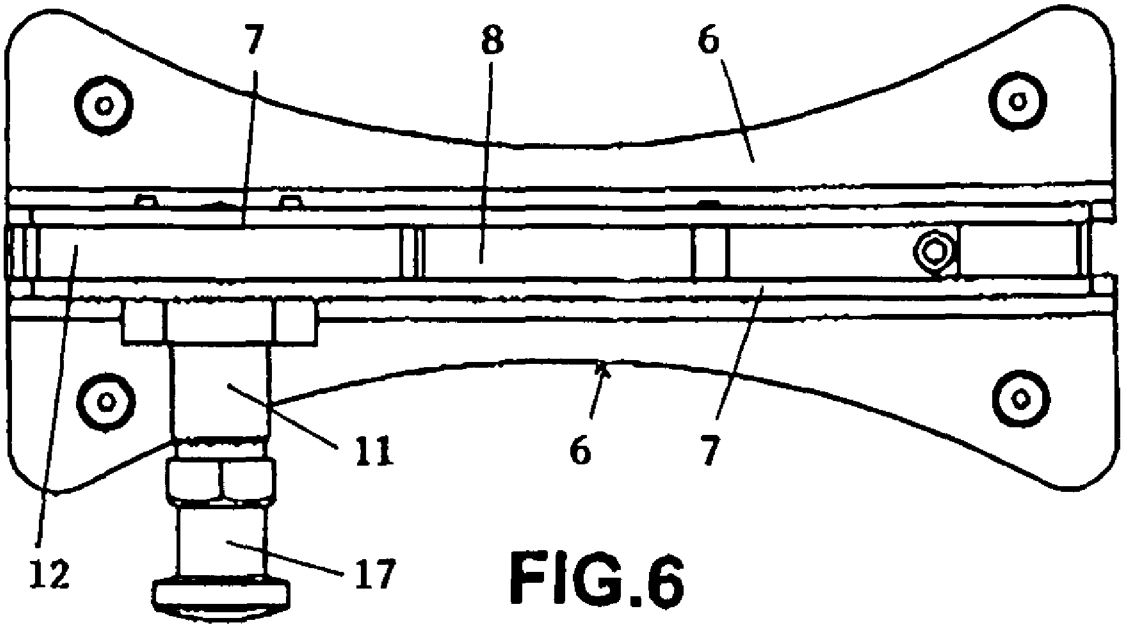
FIG. 6 is a view of the connector from above.
Figure 7:
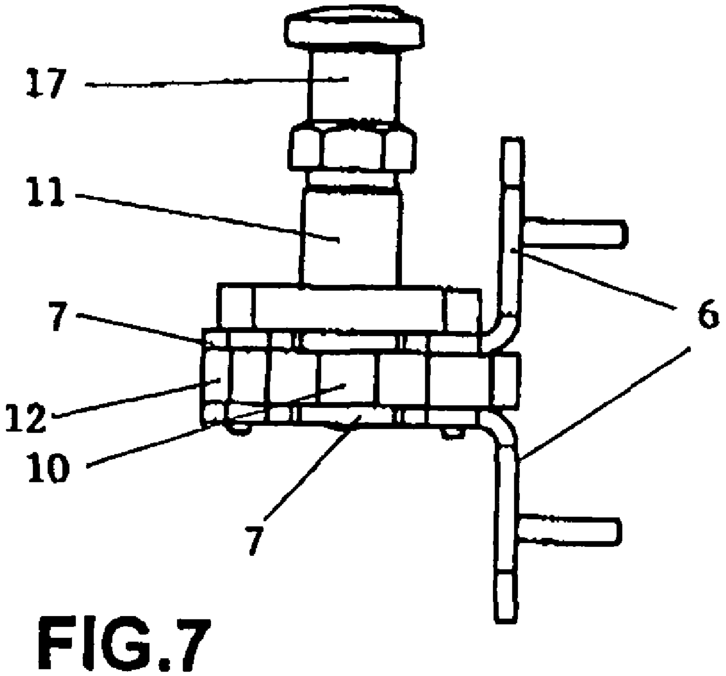
FIG. 7 is a view of the snap-in pin.

The mounts 3 are the essential instruments for the automatic adjustment of the group of loud speaker boxes 1 to the desired angle position. The mount, depicted in a perspective elevation in FIG. 3 and with its individual parts in FIG. 2, comprises two angled sheets 6, 7, the legs 6 of which are screwed to the back wall of the loud speaker box 1 and the legs 7 of which enclose a channel 8 in which the connector 4 is displaceably borne. The width of the channel 8 is defined by a spacing sleeve 19 that is fastened and secured by a screw 15. On their one side, the leg 7 of the angled sheets 6, 7 have a group of holes 9 that are arranged in two rows, one above the other. The other side of the leg 7 of one of the angled sheets 6, 7 bears a housing 111 that receives a snap-in pin 10. The end of this snap-in pin 10 has a grip 17.

So that the connector 4 displaceably borne in the channel 8 cannot fall out of the channel, arranged above and below its path are two guide units 12 that have the form of a block that is rounded on at least one longitudinal side and that have the width of the channel, or in the form of a sleeve, pin, or screw having this width. The guide units primarily ensure that the more central hole of the connector 4 is drawn past the snap-in pin such that the snap-in pin snaps into this hole.

The connector 4 at its end has a through-hole 13 and has another hole 14 in the opposing third of the length of the connector. The hole 13 is intended for a pin, not shown, that can be e.g. a ball locking pin, and that is inserted into one of the two holes 9 of the two-row group of holes 9. When the connector 4 is displaced, the snap-in pin 10 that is under spring pressure drops into the hole 14 because the guide units 12 guide the connector 4 such that its hole 14 is guided through under the snap-in pin 10.

Between the two holes 13, 14 that have been passed through, the connector 4 also has a blind hole 16 into which the snap-in pin 10 drops when the loud speaker box is put in the transport position after the loud speaker box group has been disassembled. On one of their end faces, the legs 7 have a recess 18 so that it is possible to grasp the connector 4 with two fingers and displace it.

The two legs 7 are maintained at the provided spacing from one another by a spacer sleeve and a pin inserted through it and through two holes in the legs 7, so that the connector 4 can slide through the channel 8 without resistance until it snaps into its snap-in position.

Assembly of the loud speaker group occurs such that the loud speaker boxes 1 are placed on an even surface, next to one another, with their back sides facing up, such that the front sides of the loud speaker boxes are coupled to one another by inserting hinge pins into the joints 2, in that then, the snap-in pins 10 are retracted from the blind holes 16 in the connector and placed in their non-operating position. Then one connector 4 after the other is moved so that the end hole 13 is in front of one of the holes 9 of the hole group of the adjacent loud speaker box 1 and the pin that is not shown is inserted through the holes 9 in both legs 7 that are aligned with one another and thus the connector 4 is fixed at its one end. Then the first loud speaker box 1 is lifted using the cable 5 after all of the snap-in pins have been moved to the operating position, and then the coupled second loud speaker box 1, which has been coupled to the first loud speaker box 1 via the joint 2, the connector 4 from the first loud speaker box 1 being displaced in the mount 3 of the adjacent loud speaker box 1 until the snap-in pin 10 drops into the hole 14 of the connector 4. Thus the connection between the two loud speaker boxes is created automatically. As the lifting continues, the other loud speaker boxes automatically assume their desired angle positions. The process is reversed for disassembling the loud speaker group in that the snap-in pins 10 are manually retracted from the connecting position and left in the non-operating position and the joint pins are removed from the joints on the front sides of the loud speaker boxes.

LIST OF REFERENCE NUMBERS

1 Loud speaker box
2 Joint
3 Mount
4 Connector
5 Cable
6 Leg
7 Leg
8 Channel
9 Hole in a hole group
10 Snap-in pin
11 Housing
12 Guide unit
13 End hole
14 Hole
15 Screw
16 Blind hole
17 Grip
18 Recess in the legs
19 Spacing sleeve

The invention claimed is:

1. A loud speaker group, comprising:

loud speaker boxes;

at least one joint being disposed on a front side of each of the loud speaker boxes for pivotably connecting said loud speaker boxes one to an adjacent other;

a mount being disposed on a back side of each of the loud speaker boxes, said mount including a pair of legs opposed to one another thereby defining a channel therebetween;

connectors each displaceably receivable in the channel for connecting the loud speaker boxes one to the adjacent other at a desired angle, said connectors each including a first hole proximate a first end thereof, the pair of legs including a group of holes proximate a first end thereof for receiving a pin that extends through a one of said group of holes and through said first hole of an adjacent one of the connectors associated with an adjacent one of the loud speaker boxes when said first hole is aligned with said one of said group of holes;

a pin housing carried on one of said pair of legs proximate a second end of the pair of legs;

a spring-loaded snap-in pin including a grip at a first end thereof, said spring-loaded snap-in pin being received in said pin housing for displaceable movement against a force of a spring, said snap-in pin being receivable in a second hole that is disposed more centrally than said first hole and proximate to a second end of each of said connectors; and a first guide unit being disposed above the snap-in pin and a second guide unit being disposed below the snap-in pin which collectively limit the channel above and below said snap-in pin, and which function as guides for the connector when received in the channel.

2. The loud speaker group according to claim 1, wherein:

the connector is configured as a flat bar; and said snap-in pin automatically snaps into said second hole when an associated one of said connectors experiences a displacement movement.

3. The loud speaker group according to claim 1, wherein each of said connectors includes a blind hole disposed between said first and second holes in which the snap-in pin that is under spring force is restably engageable when each of said connectors is in a non-operating state.

4. The loud speaker group according to claim 1, wherein each of the first and second guide units is a same width as the channel and includes one of a block that is rounded on at least one longitudinal side thereof, a sleeve, a pin, or a screw.

5. The loud speaker group according to claim 1, wherein said group of holes includes closely disposed holes for receiving the pin.

6. The loud speaker group according to claim 1, wherein:

said pair of legs is connected on upper edges thereof by screws; and a sleeve is borne between the legs and received over each of the screws.

7. The loud speaker group according to claim 1, wherein said pair of legs are parts of a U-profile or angle profiles that are fixed to the back side of each of the loud speaker boxes.

8. The loud speaker group according to claim 7, wherein said pair of legs are parts of the angle profiles which further include an other pair of legs by which the mount is fixed to each of the loud speaker boxes.

9. The loud speaker group according to claim 7, wherein said mount is fixed to each of said speakers by being bolted thereto.

10. A loud speaker group, comprising:

loud speaker boxes;

at least one joint being disposed on a front side of each of the loud speaker boxes for pivotably connecting said loud speaker boxes one to an adjacent other;

a mount being disposed on a back side of each of the loud speaker boxes, said mount including a pair of angled sheets defining a first pair of legs for mounting the angled sheets to the back side of the loud speaker boxes and a second pair of legs opposed to one another thereby defining a channel therebetween;

connectors each displaceably receivable in the channel for connecting the loud speaker boxes one to the adjacent other at a desired angle, said connectors each including a first hole proximate a first end thereof, the second pair of legs that define the channel including a group of holes proximate a first end thereof for receiving a pin that extends through a one of said group of holes and through said first hole of an adjacent one of the connectors associated with an adjacent one of the loud speaker boxes when aligned with said one of said row of holes, a pin housing carried on one of said second pair of legs proximate a second end of the second pair of legs;

a spring-loaded snap-in pin including a grip at a first end thereof, said spring-loaded snap-in pin being received in said pin housing for displaceable movement against a force of a spring, said snap-in pin being receivable in a second hole that is disposed more centrally than said first hole and proximate to a second end of each of said connectors; and a first guide unit being disposed above the snap-in pin and a second guide unit being disposed below the snap-in pin which collectively limit the channel above and below said snap-in pin to serve as guides for the connector when received in the channel.

11. A loud speaker group, comprising:

loud speaker boxes;

at least one joint being disposed on a front side of each of the loud speaker boxes for pivotably connecting said loud speaker boxes one to an adjacent other;

a mount being disposed on a back side of each of the loud speaker boxes, said mount including a pair of legs opposed to one another thereby defining a channel therebetween;

connectors each displaceably receivable in the channel and non-latchedly connecting the loud speaker boxes one to the adjacent other at a desired angle, said connectors each including a first hole proximate a first end thereof, the pair of legs including a group of holes proximate a first end thereof for receiving a pin that extends through a one of said group of holes and through said first hole of an adjacent one of the connectors associated with an adjacent one of the loud speaker boxes when said first hole is aligned with said one of said group of holes;

a pin housing carried on one of said pair of legs proximate a second end of the pair of legs;

a spring-loaded snap-in pin including a grip at a first end thereof, said spring-loaded snap-in pin being received in said pin housing for displaceable movement against a force of a spring, said snap-in pin being receivable in a second hole that is disposed more centrally than said first hole and proximate to a second end of each of said connectors; and a first guide unit being disposed above the snap-in pin and a second guide unit being disposed below the snap-in pin which collectively limit the channel above and below said snap-in pin, and which function as guides for the connector when received in the channel.

* * * * *